US010726331B1

(12) United States Patent
Burr

(10) Patent No.: US 10,726,331 B1
(45) Date of Patent: Jul. 28, 2020

(54) NEURAL NETWORK CIRCUITS PROVIDING EARLY INTEGRATION BEFORE ANALOG-TO-DIGITAL CONVERSION

(71) Applicant: INTERNATIONAL BUSINESS MACHINES CORPORATION, Armonk, NY (US)

(72) Inventor: Geoffrey W. Burr, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/550,514

(22) Filed: Aug. 26, 2019

(51) Int. Cl.
*G06N 3/063* (2006.01)
*G06F 9/30* (2018.01)
*H03M 1/12* (2006.01)
*G06F 17/16* (2006.01)

(52) U.S. Cl.
CPC ....... *G06N 3/0635* (2013.01); *G06F 9/30036* (2013.01); *G06F 17/16* (2013.01); *H03M 1/12* (2013.01); *G11C 2213/71* (2013.01); *G11C 2213/77* (2013.01)

(58) Field of Classification Search
CPC ... G06N 3/0635; G06F 17/16; G06F 9/30036; H03M 1/12; G11C 2213/71
USPC .................................................. 341/155, 158
See application file for complete search history.

(56) References Cited

U.S. PATENT DOCUMENTS

| 4,807,168 | A | * | 2/1989 | Moopenn | ............... | G06N 3/063 706/37 |
| 5,479,169 | A | * | 12/1995 | Stryjewski | ............ | H03M 1/145 341/156 |
| 7,345,604 | B2 | * | 3/2008 | Watson | .................... | H03M 1/12 341/133 |
| 9,813,048 | B2 | | 11/2017 | Roy et al. | | |
| 10,089,576 | B2 | | 10/2018 | Gao et al. | | |
| 2018/0300618 | A1 | | 10/2018 | Obradovic et al. | | |
| 2018/0321942 | A1 | | 11/2018 | Yu et al. | | |
| 2018/0341862 | A1 | | 11/2018 | Ehrman | | |

FOREIGN PATENT DOCUMENTS

WO      2008014023 A2      1/2008

OTHER PUBLICATIONS

Mittal, "A Survey of ReRAM-Based Architectures for Processing-In-Memory and Neural Networks", MDPI 2018.

* cited by examiner

*Primary Examiner* — Brian K Young
(74) *Attorney, Agent, or Firm* — Erik A. Huestis; Stephen J. Kenny; Foley Koag LLP

(57) ABSTRACT

Neural network circuits providing early integration before ADC are described. Comparators are adapted to compare a plurality of output analog voltages from a first synaptic array to a predetermined threshold to generate a vector of bits indicating whether the plurality of analog voltages exceed the predetermined threshold, and transmit the vector of bits via a network. At least one ADC is configured to convert the plurality of analog voltages to a vector of digital values, and transmit the vector of digital values via the network. At least one modulator is configured to receive the vector of bits from the network, provide pulses to each of a plurality of input wires of a second synaptic array based on the vector of bits, receive the vector of digital values from the network, and provide pulses to each of the plurality of input wires based on the vector of digital values.

20 Claims, 9 Drawing Sheets

NEURAL NETWORK CIRCUITS PROVIDING EARLY INTEGRATION BEFORE ANALOG-TO-DIGITAL CONVERSION

BACKGROUND

Embodiments of the present disclosure relate to neural network circuits, and more specifically, to circuits adapted to provide early integration before analog-to-digital conversion.

BRIEF SUMMARY

According to embodiments of the present disclosure, neural network circuits are provided. A first synaptic array is configured to output a plurality of analog voltages. A second synaptic array has a plurality of input wires. A network is operatively coupled to the first synaptic array and the second synaptic array. At least one comparator is operatively coupled to the first synaptic array. The at least one comparator is adapted to compare the plurality of analog voltages to a predetermined threshold to generate a vector of bits, each bit of the vector of bits indicating whether one of the plurality of analog voltages exceeds the predetermined threshold, and transmit the vector of bits via the network. At least one analog-to-digital converter is operatively coupled to the first synaptic array and to the network. The at least one analog-to-digital converter is configured to convert the plurality of analog voltages to a vector of digital values, and transmit the vector of digital values via the network. At least one modulator is operatively coupled to the second synaptic array and to the network. The at least one modulator is configured to receive the vector of bits from the network, process the vector of bits, said processing the vector of bits comprising providing a pulse to each of the plurality of input wires of the second synaptic array when a corresponding bit of the vector of bits indicates that the predetermined threshold was exceeded, receive the vector of digital values from the network, and process the vector of digital values, said processing the vector of digital values comprising providing a pulse to each of the plurality of input wires of the second synaptic, each pulse having a duration proportional to a corresponding digital value of the vector of digital values. Said receiving the vector of bits and/or processing the vector of bits occurs in parallel to said converting the plurality of analog voltages and/or transmitting the vector of digital values.

According to embodiments of the present disclosure, methods of and computer program products for operating neural network circuits are provided. A plurality of analog voltages output from a first synaptic array are compared to a predetermined threshold to generate a vector of bits. Each bit of the vector of bits indicates whether one of the plurality of analog voltages exceeds the predetermined threshold. The vector of bits is processed. Processing the vector of bits comprises providing a pulse to each of a plurality of input wires of a second synaptic array when a corresponding bit of the vector of bits indicates that the predetermined threshold was exceeded. In parallel with said processing of the vector of bits, the plurality of analog voltages is converted to a vector of digital values. Subsequent to said processing the vector of bits, a pulse is provided to each of the plurality of input wires of the second synaptic array, each pulse having a duration proportional to a corresponding digital value of the vector of digital values.

DETAILED DESCRIPTION

Figure 1:
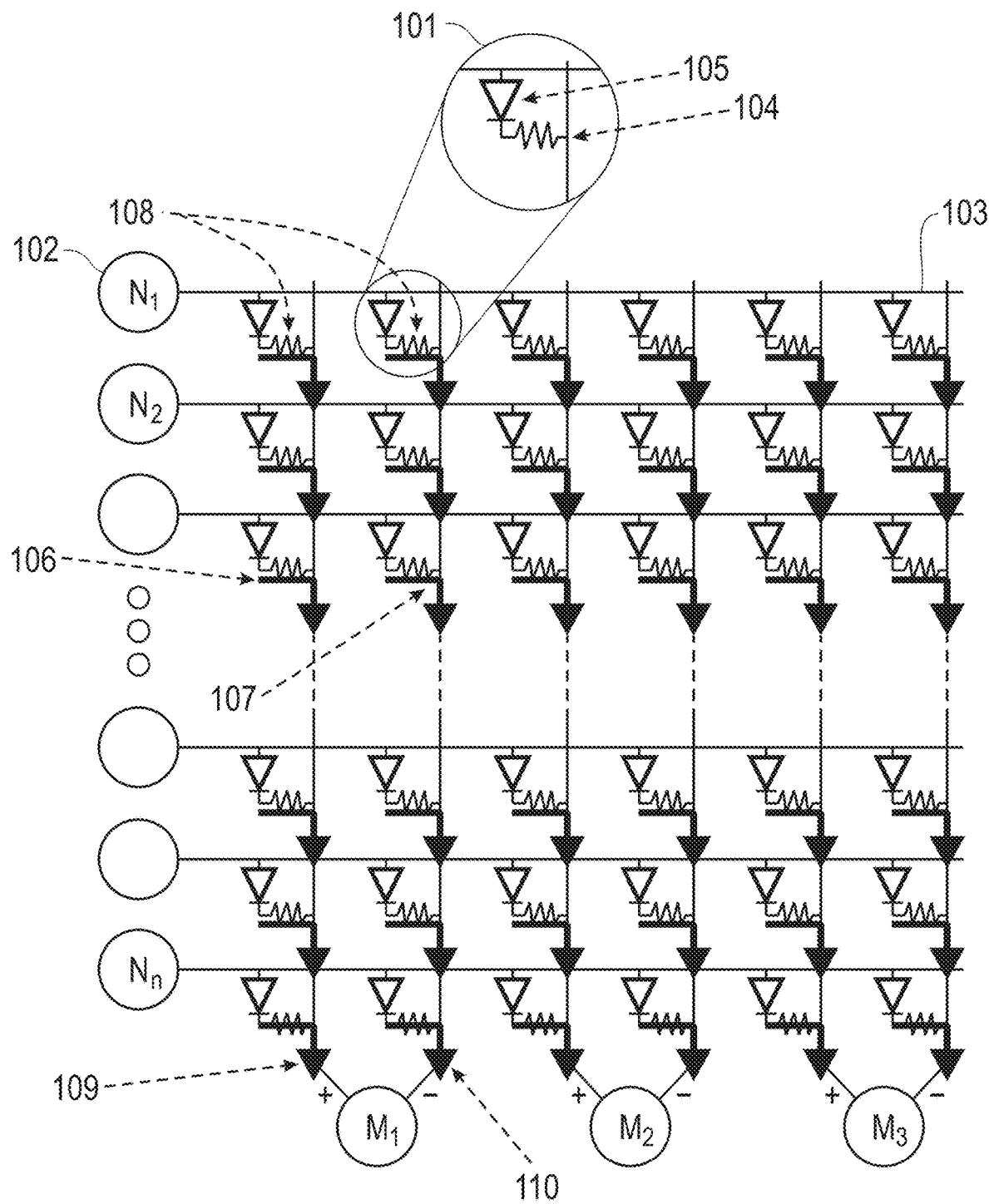
FIG. 1 illustrates an exemplary nonvolatile memory-based crossbar array, or crossbar memory according to embodiments of the present disclosure.

Artificial neural networks (ANNs) are distributed computing systems, which consist of a number of neurons interconnected through connection points called synapses. Each synapse encodes the strength of the connection between the output of one neuron and the input of another. The output of each neuron is determined by the aggregate input received from other neurons that are connected to it. Thus, the output of a given neuron is based on the outputs of connected neurons from the preceding layer and the strength of the connections as determined by the synaptic weights. An ANN is trained to solve a specific problem (e.g., pattern recognition) by adjusting the weights of the synapses such that a particular class of inputs produce a desired output.

ANNs may be implemented on various kinds of hardware, including crossbar arrays, also known as crosspoint arrays or crosswire arrays. A basic crossbar array configuration includes a set of conductive row wires and a set of conductive column wires formed to intersect the set of conductive row wires. The intersections between the two sets of wires are separated by crosspoint devices. Crosspoint devices function as the ANN's weighted connections between neurons.

In various embodiments, a nonvolatile memory-based crossbar array, or crossbar memory, is provided. A plurality of junctions are formed by row lines intersecting column lines. A resistive memory element, such as a non-volatile memory, is in series with a selector at each of the junctions coupling between one of the row lines and one of the column lines. The selector may be a volatile switch or a transistor, various types of which are known in the art. It will be appreciated that a variety of resistive memory elements are suitable for use as described herein, including memristors, phase-change memories, conductive-bridging RAMs, and spin-transfer torque RAMs.

A fixed number of synapses may be provided on a core, and then multiple cores connected to provide a complete neural network. In such embodiments, interconnectivity between cores is provided to convey outputs of the neurons on one core to another core, for example, via a packet-switched or circuit-switched network. In a packet-switched network, greater flexibility of interconnection may be achieved, at a power and speed cost due to the need to transmit, read, and act on address bits. In a circuit-switched network, no address bits are required, and so flexibility and re-configurability must be achieved through other means.

In various exemplary networks, a plurality of cores is arranged in an array on a chip. In such embodiments, relative positions of cores may be referred to by the cardinal directions (north, south, east, west). Data carried by neural signals may be encoded in the pulse-duration carried by each wire, using digital voltage levels suitable for buffering or other forms of digital signal restoration.

One approach to routing is to provide Analog-to-Digital converters at the output edge of each core, paired with a digital network-on-chip for rapidly routing packets to any other core, and with Digital-to-Analog converters at the input edge of each core.

In various computing applications including implementation of Deep Neural Networks (DNNs) using analog resistive memory elements, there is frequently a need to perform analog-to-digital conversion (ADC) at the bottom edge of one array before conveying that data to the edge of a next array where it will be used to drive pulse-modulated data. In such implementations, the large size of each ADC leads to the need to time-multiplex the use of shared ADC resources. This then significantly extends the total operation time required to complete the final time-multiplexed use of each shared ADC. Since ADC circuitry is area-inefficient, it takes significant time to perform the ADC operations using shared ADC resources, transmit the data, prep the new data to modulate input pulses at the next array, and wait for the longest possible pulse to complete at the next array.

There remains a need in the art for a method to perform pulse-modulated integrations at the subsequent array more rapidly. Accordingly, various embodiments of the present disclosure provide for transmission of a most significant bit (MSB) for early integration before ADC (Analog-to-Digital Conversion) for neural network computing.

Referring to FIG. 1, an exemplary nonvolatile memory-based crossbar array, or crossbar memory, is illustrated. A plurality of junctions 101 are formed by row lines 102 intersecting column lines 103. A resistive memory element 104, such as a non-volatile memory, is in series with a selector 105 at each of the junctions 101 coupling between one of the row lines 102 and one of the column lines 103. The selector may be a volatile switch or a transistor, various types of which are known in the art.

It will be appreciated that a variety of resistive memory elements are suitable for use as described herein, including memristors, phase-change memories, conductive-bridging RAMs, spin-transfer torque RAMs.

Figure 2:
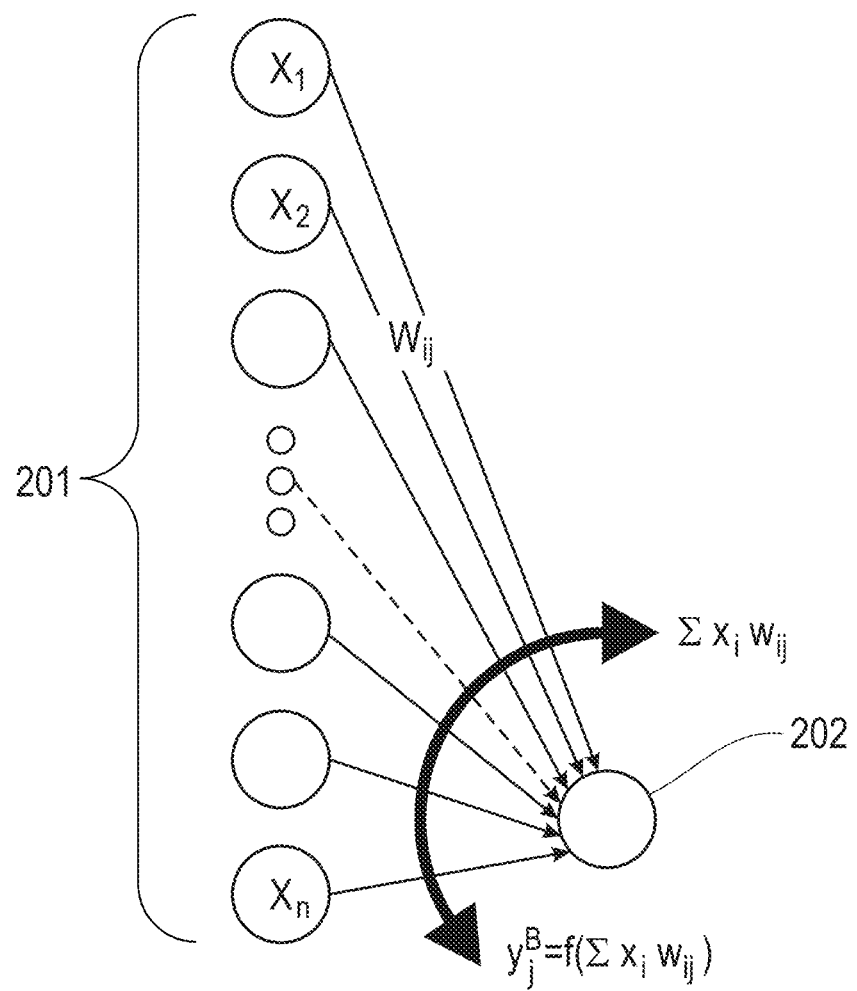
FIG. 2 illustrates exemplary synapses within a neural network according to embodiments of the present disclosure.

Referring to FIG. 2, exemplary synapses within a neural network are illustrated. A plurality of inputs $x_1 \ldots x_n$ from nodes 201 are multiplied by corresponding weights $w_{ij}$. The sum of the weights, $\Sigma x_i w_{ij}$ is provided to a function $f(\cdot)$ at node 202 to arrive at a value $y_j^B = f(\Sigma x_i w_{ij})$. It will be appreciated that a neural network would include a plurality of such connections between layers, and that this is merely exemplary.

Figure 3:
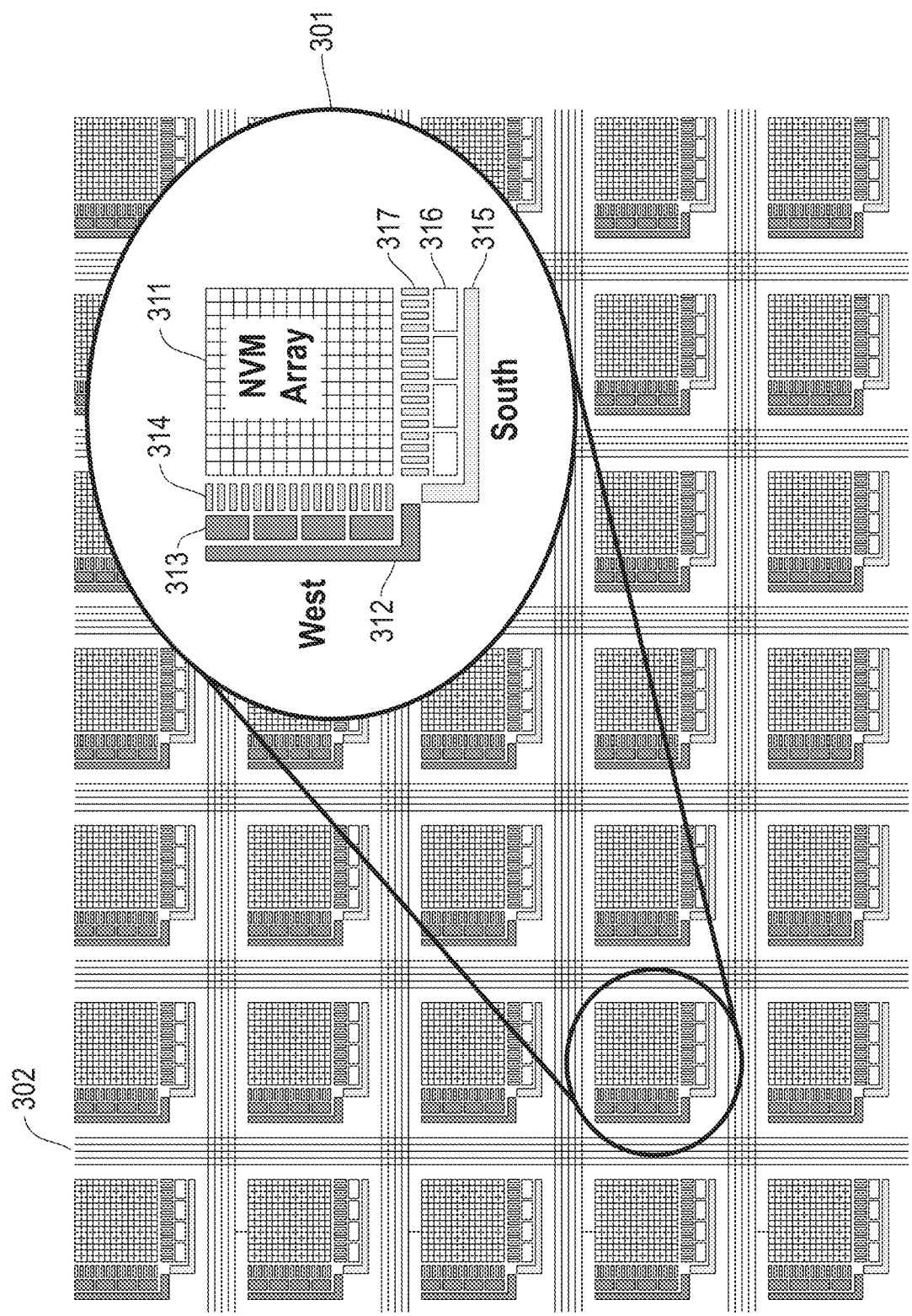
FIG. 3 illustrates an exemplary array of neural cores according to embodiments of the present disclosure.

Referring now to FIG. 3, an exemplary array of neural cores is illustrated according to embodiments of the present disclosure. Array 300 includes a plurality of cores 301. The cores in array 300 are interconnected by lines 302, as described further below. In this example, the array is two-dimensional. However, it will be appreciated that the present disclosure may be applied to a one-dimensional or three-dimensional array of cores. Core 301 includes non-volatile memory array 311, which implements synapses as described above. Core 301 includes a west side and a south side, each of which may serve as input while the other serves as output. It will be appreciated that the west/south nomenclature is adopted merely for ease of reference to relative positioning, and is not meant to limit the direction of inputs and outputs.

In various exemplary embodiments, the west side includes support circuitry 312, which is dedicated to the entire side of core 301, shared circuitry 313, which is dedicated to a subset of rows, and per-row circuitry 314, which is dedicated to individual rows. In various embodiments the south side likewise includes support circuitry 315, which is dedicated to the entire side of core 301, shared circuitry 316, which is dedicated to a subset of columns, and per-column circuitry 317, which is dedicated to individual columns.

Figure 4:
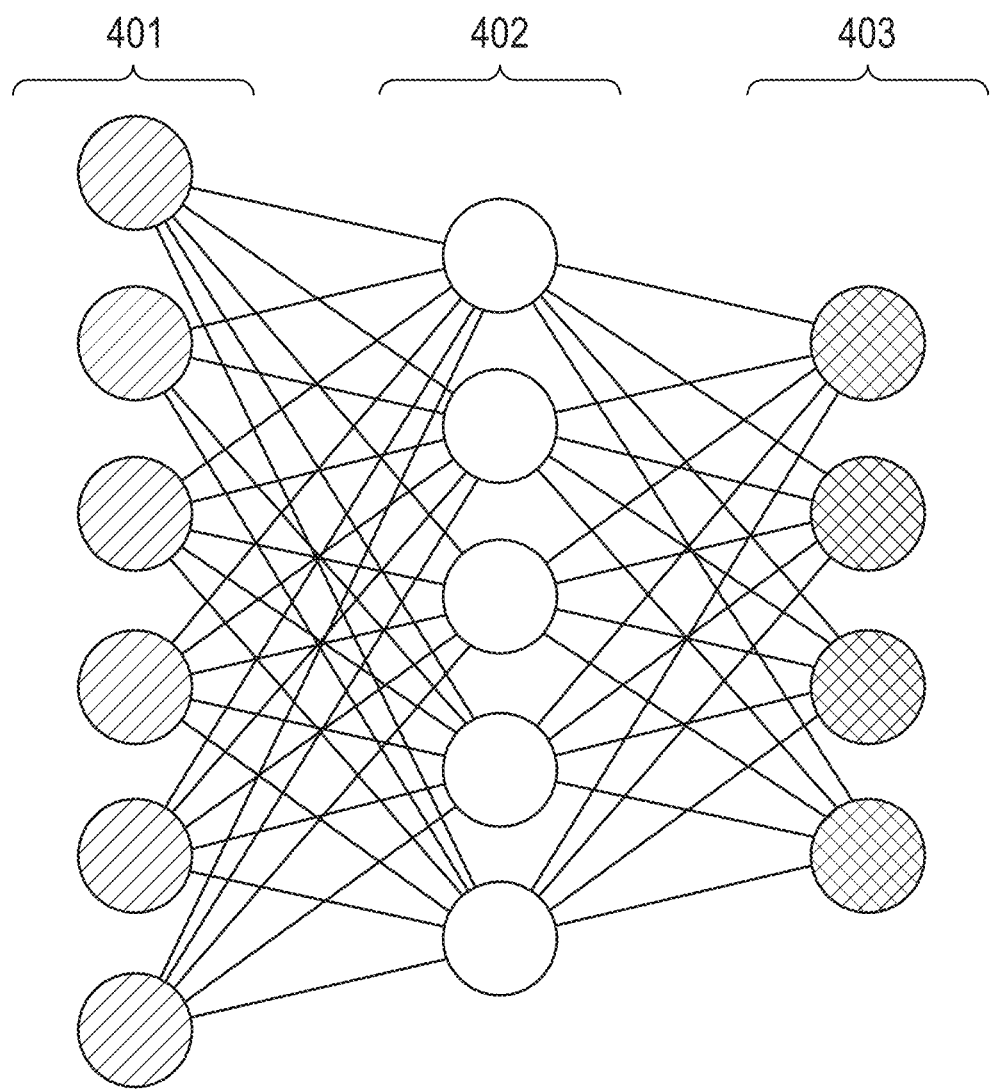
FIG. 4 illustrates an exemplary neural network according to embodiments of the present disclosure.

Referring to FIG. 4, an exemplary neural network is illustrated. In this example, a plurality of input nodes 401 are interconnected with a plurality of intermediate nodes 402. In turn, intermediate nodes 402 are interconnected with output nodes 403. It will be appreciated that this simple feed-forward network is presented solely for illustrative purposes, and the present disclosure is applicable irrespective of the particular neural network arrangement.

Figure 5:
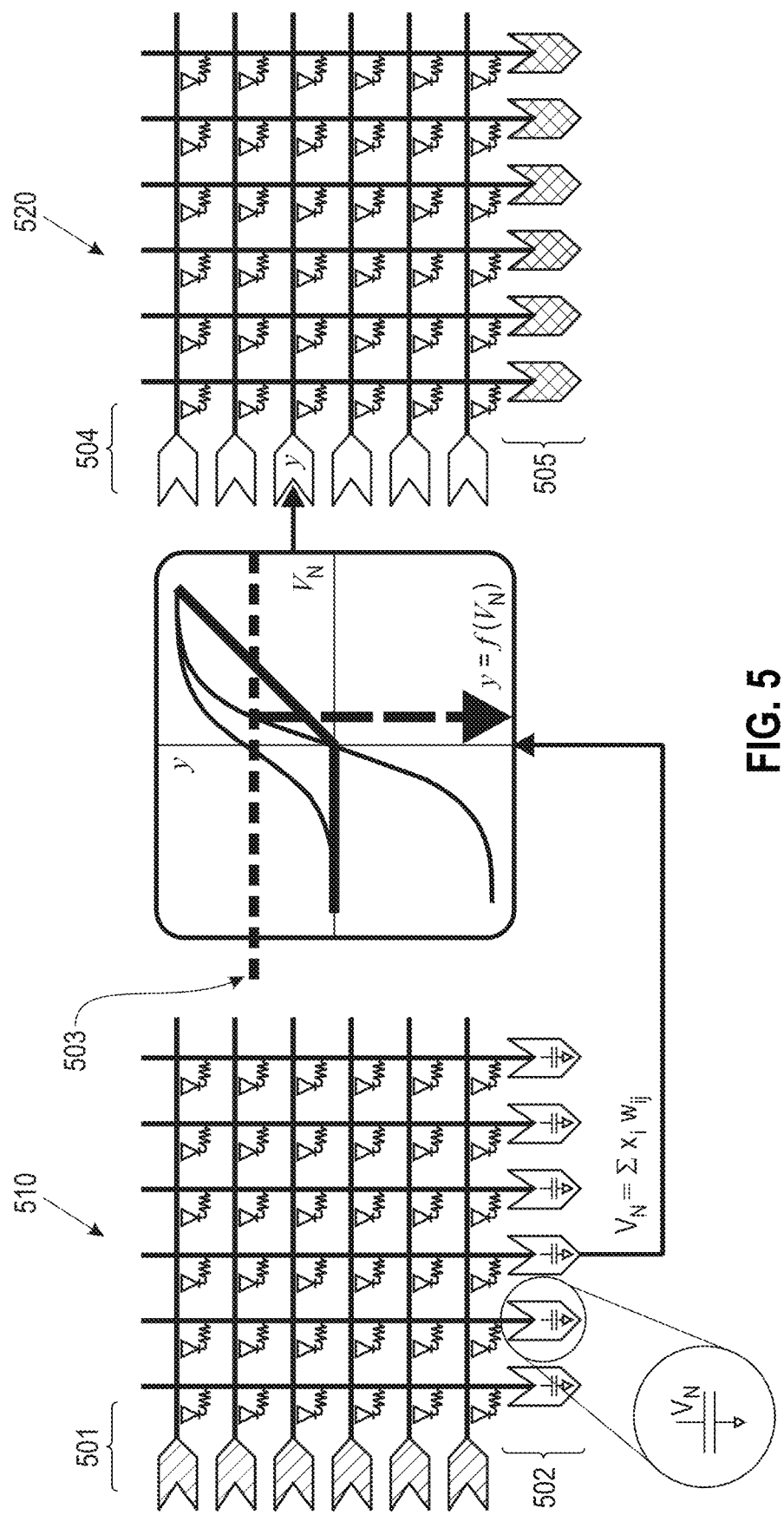
FIG. 5 illustrates an exemplary multi-core neural network according to embodiments of the present disclosure.

Referring to FIG. 5, an exemplary multi-core neural network is illustrated. In this example, two cores are depicted, which may be implemented as described above. Input rows 501 (which, for example, may correspond to input nodes 401), pass through crossbar array 510, to provide an output voltage (given as $V_N = \Sigma x_i w_{ij}$) at each of output columns 502. A transfer function is applied, yielding an activation y, which is provided to one of input rows 504. In this example, $y = f(V_N)$, where $f$ is an arbitrary transfer function. Irrespective of the selected transfer function, one comparator is needed at the analog voltage that induces exactly half the full integration time, as shown by threshold 503.

In embodiments of the present disclosure, a single bit per neuron is transmitted from a first synaptic array (e.g., crossbar 510) to the next synaptic array (e.g., crossbar 520) within a given neural network. If this bit is 1 (high), then a pulse of half the maximum duration is immediately modulated onto the next array. This integration can occur at the next array in parallel with the process of performing the precise ADC operations, transmitting the N bits per neuron from one array to the next, and performing any necessary squashing operations.

In various embodiments, the analog comparator threshold used to compute the originally transmitted MSB is designed such that this level corresponds to exactly the transition between just below and just above half of the maximum resultant modulated pulse. As such, this idea is independent of any squashing function applied on the N bits of data. When the N bits of data per neuron is finally transmitted and squashed, the second array need only apply the N−1 lowest bits to modulate pulses. The same exact total pulse-modulated duration is applied to the second array, but overall approximately half the maximum duration has been saved by the early and efficient transmission of the MSB information.

Figure 6A:
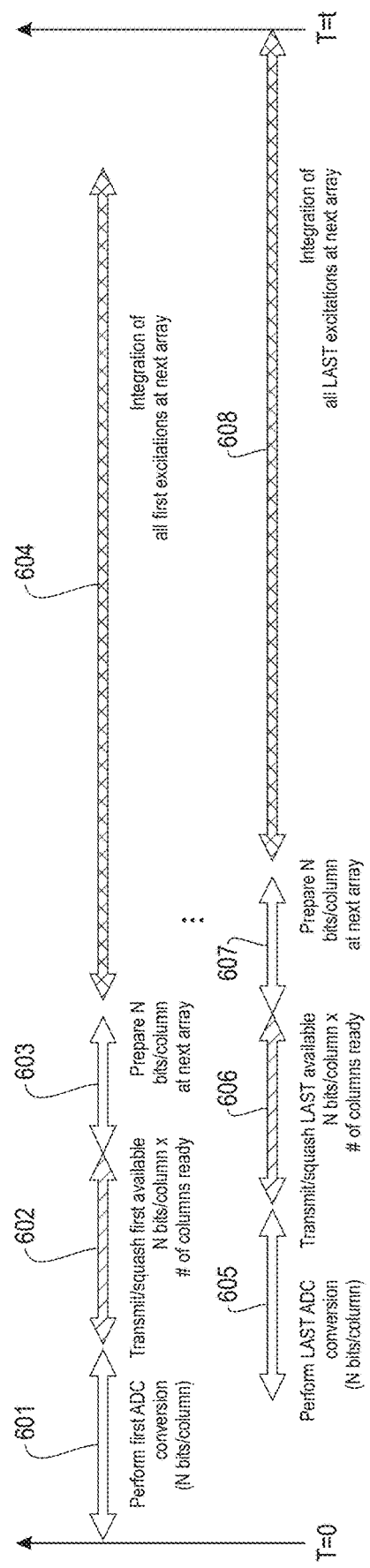
FIGS. 6A-B are timelines illustrating integration according to embodiments of the present disclosure.
Figure 6B:
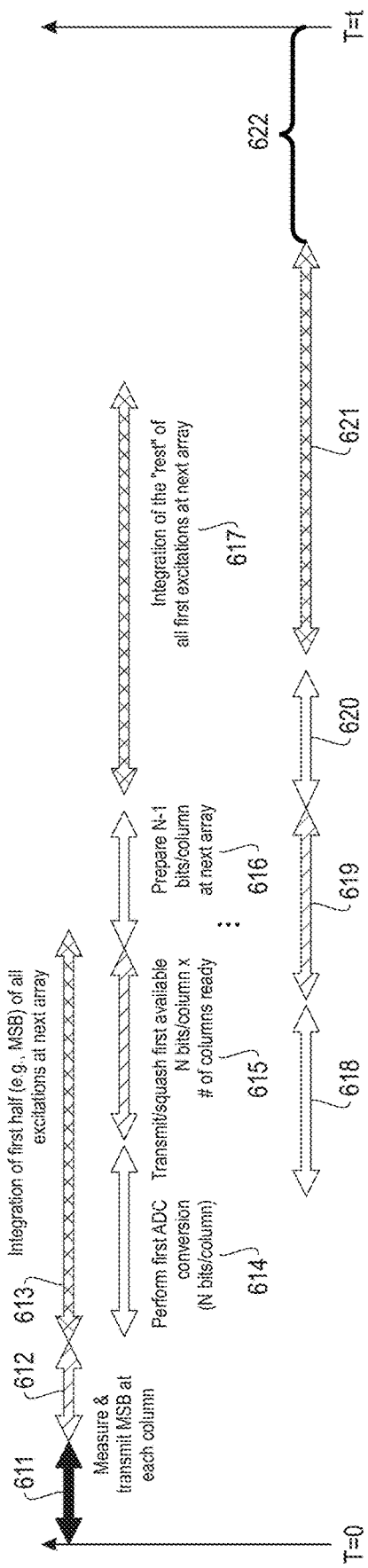

Referring to FIG. 6, timelines are given for integration according to embodiments of the present disclosure. In both FIGS. 6A and 6B, the timeline runs from T=0 to T=t. At T=0, arbitrary prior integrations finish, leaving charge on capacitors and final values of $V_N$ ready for ADC conversion.

FIG. 6A illustrates the operation of a set of shared ADC resources without early integration. The first ADC conversion of N bits/column is performed at 601 by a source core. The result is transmitted and or squashed to a subsequent core at 602. At this phase, the transmitted values amount to N bits/ready column. At 603, these first received N bits/column are prepared for integration at a destination core. Integration of the first available excitations may then begin at 604. The process is repeated for all columns as they become ready. Accordingly, the last ADC conversion occurs at 605. These final bits are transmitted and/or squashed at 606. The associated received bits are prepared at the destination core at 607, allowing integration of the last excitations at 608. Integration of all received excitations is completed at T=t.

FIG. 6B illustrates the operation of a set of shared ADC resources with early integration according to embodiments of the present disclosure. Here, the most significant bit is measured at 611 and then transmitted at 612 for each column. Integration of the first half of all excitations may then proceed at 613 on the destination core. In parallel to integration at the destination core, the first ADC conversion of N bits/column is performed at 614 by the source core. The result is transmitted and or squashed to the destination core at 615. At this phase, the transmitted values amount to N bits/ready column. At 616, the received N bits/column are prepared at the destination core. Integration of the first available excitations, beyond the most significant bit, may then begin at 617. The process is repeated for all columns as they become ready. Accordingly, the last ADC conversion occurs at 618. The resulting bits are transmitted and/or squashed at 619. The received bits are prepared at the destination core at 620, allowing integration of the last excitations at 621. The early integration of the most significant bit (at 613) allows the remaining integration (at 617 and 621) to complete well before T=t. The overall time savings is shown at 622.

Figure 7:
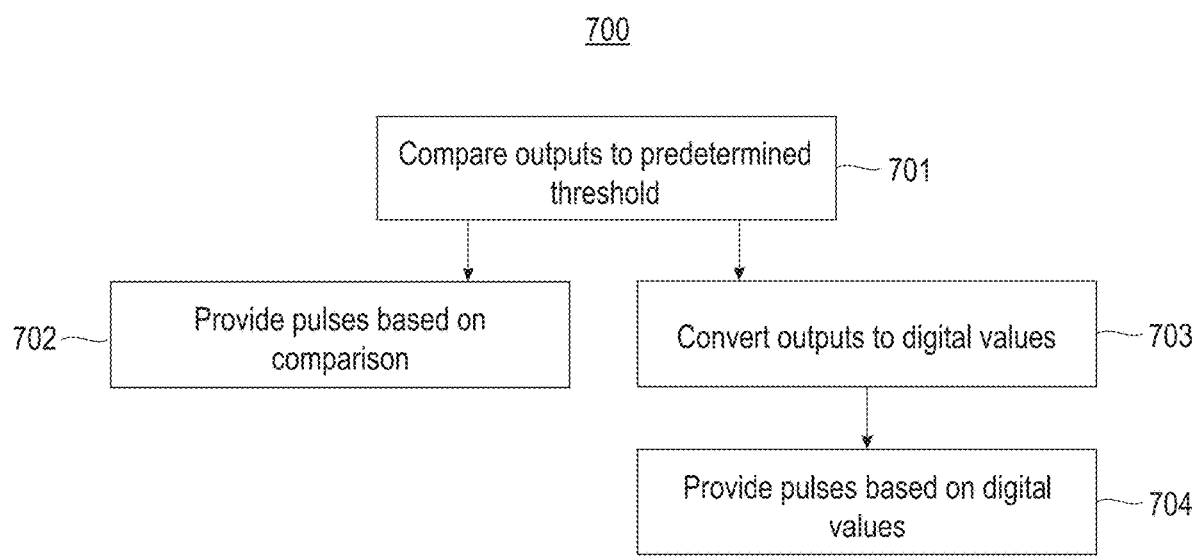
FIG. 7 illustrates a method of operating a neural network according to embodiments of the present disclosure.

Referring to FIG. 7, a method of operating a neural network is illustrated according to embodiments of the present disclosure. At 701, a plurality of analog voltages output from a first synaptic array are compared to a predetermined threshold to generate a vector of bits. Each bit of the vector of bits indicates whether one of the plurality of analog voltages exceeds a predetermined threshold. At 702, the vector of bits is processed. Processing the vector of bits comprises providing a pulse to each of a plurality of input wires of a second synaptic array when a corresponding bit of the vector of bits indicates that the predetermined threshold was exceeded. At 703, in parallel with said processing of the vector of bits, the plurality of analog voltages is converted to a vector of digital values. At 704, subsequent to said processing the vector of bits, a pulse is provided to each of the plurality of input wires of the second synaptic array, each pulse having a duration proportional to a corresponding digital value of the vector of digital values.

In various embodiments, a set of circuits is provided for converting a vector of analog voltages at the edge of a first array into a vector of durations at the edge of a second array. A comparator compares each analog voltage against a common analog threshold, thereby producing a most-significant amplitude bit for each analog voltage, giving rise to a vector of most-significant amplitude bits. A transmission system conveys the vector of most-significant amplitude bits from the edge of the first array to the edge of the second array. A circuit injects a vector of constant duration pulse signals into the second array, in view of the value of the most-significant amplitude bit. A plurality of A/D converters convert the analog voltages at the edge of the first array into a vector of high-resolution residual digital data representations that accommodate the vector of already computed most-significant amplitude bits. A transmission system conveys the vector of high-resolution residual digital data from the edge of the first array to the edge of the second array. A circuit introduces a vector of varying duration pulse signals, in view of the values of the high-resolution residual digital data vector. Operations performed on the most-significant amplitude bits (comparing, conveying the vector of most-significant amplitude bits, and signal injection of constant durations into the second array) take place in parallel with operations of the A/D converters (converting, conveying the vector of high-resolution residual digital data, and signal injection of varying durations into the second array).

In some embodiments, the analog voltages represent signed quantities, for which the most-significant amplitude bit is turned on only for positive analog voltages exceeding the common threshold. In some embodiments, the analog voltages represent signed quantities, and two comparators (having respective common analog thresholds) are used.

In some embodiments, the analog voltages are saved on capacitors.

Figure 8:
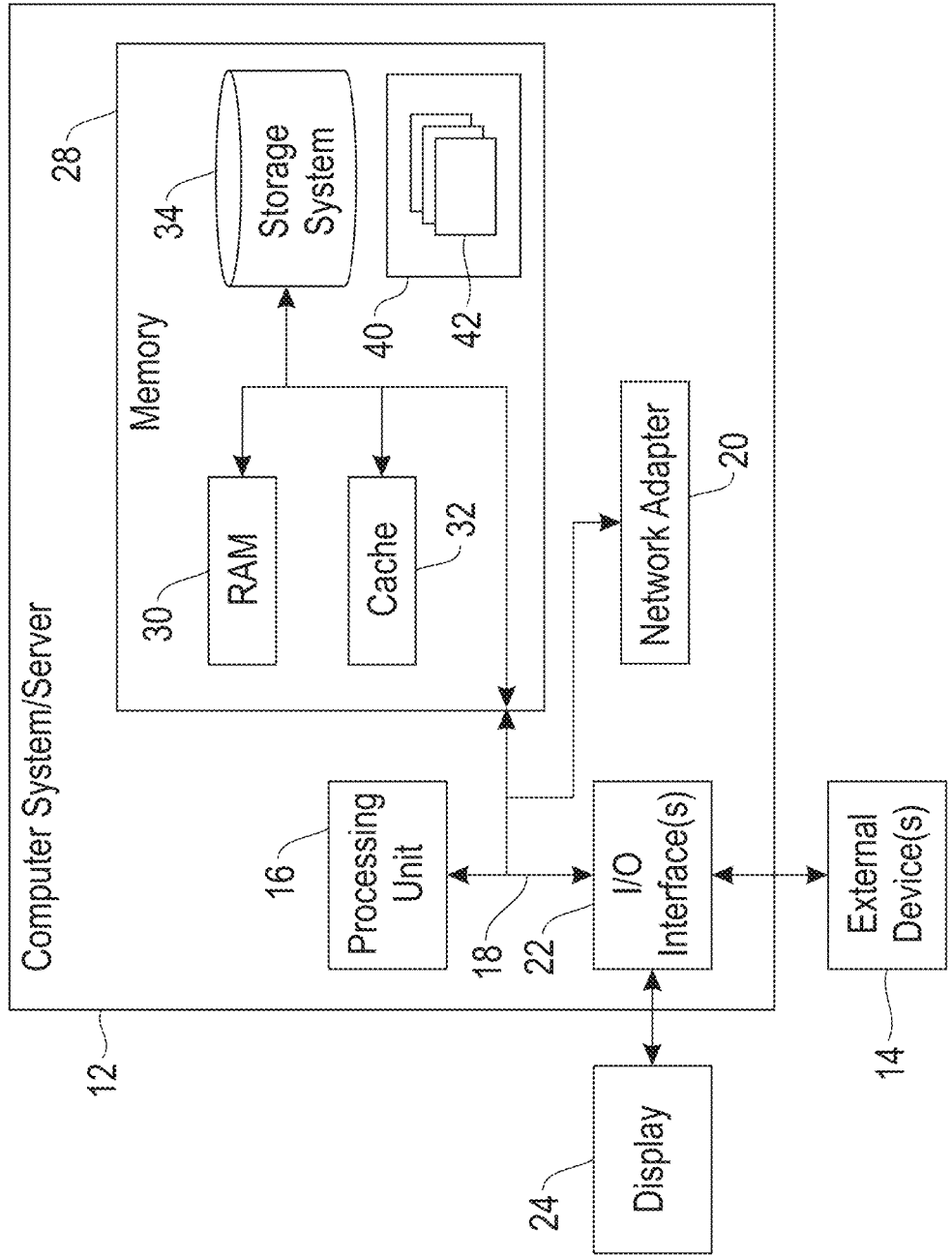
FIG. 8 depicts a computing node according to an embodiment of the present disclosure.

Referring now to FIG. 8, a schematic of an example of a computing node is shown. Computing node 10 is only one example of a suitable computing node and is not intended to suggest any limitation as to the scope of use or functionality of embodiments described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer programs products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a first synaptic array configured to output a plurality of analog voltages;
   a second synaptic array having a plurality of input wires;
   a network operatively coupled to the first synaptic array and the second synaptic array;
   at least one comparator operatively coupled to the first synaptic array, the at least one comparator adapted to
      compare the plurality of analog voltages to a predetermined threshold to generate a vector of bits, each bit of the vector of bits indicating whether one of the plurality of analog voltages exceeds the predetermined threshold, and
      transmit the vector of bits via the network;
   at least one analog-to-digital converter operatively coupled to the first synaptic array and to the network, the at least one analog-to-digital converter configured to
      convert the plurality of analog voltages to a vector of digital values, and
      transmit the vector of digital values via the network;
   at least one modulator operatively coupled to the second synaptic array and to the network, the at least one modulator configured to
      receive the vector of bits from the network,
      process the vector of bits, said processing the vector of bits comprising providing a pulse to each of the plurality of input wires of the second synaptic array when a corresponding bit of the vector of bits indicates that the predetermined threshold was exceeded,
      receive the vector of digital values from the network, and
      process the vector of digital values, said processing the vector of digital values comprising providing a pulse to each of the plurality of input wires of the second synaptic, each pulse having a duration proportional to a corresponding digital value of the vector of digital values; wherein
   said receiving the vector of bits and/or processing the vector of bits occurs in parallel to said converting the plurality of analog voltages and/or transmitting the vector of digital values.

2. The device of claim 1, wherein:
   each of the first and second synaptic arrays comprises a plurality of ordered input wires, a plurality of ordered output wires, and a plurality of synapses, each of the synapses operatively coupled to one of the plurality of input wires and to one of the plurality of output wires.

3. The device of claim 2, wherein each of the plurality of synapses comprises a resistive element configured to store a weight of a neural network.

4. The device of claim 1, wherein the synaptic arrays are configured as a trained neural network.

5. The device of claim 1, wherein each of the plurality of analog voltages corresponds to an unsigned value.

6. The device of claim 1, wherein each of the plurality of analog voltages corresponds to a signed value.

7. The device of claim 6, wherein the at least one comparator comprises at least two comparators and wherein comparing the plurality of analog voltages to the predetermined threshold comprises applying a first comparator to the analog voltages to determine a sign and applying a second comparator to the analog voltages to determine whether they exceed the predetermined threshold.

8. The device of claim 1, wherein the first synaptic array comprises a plurality of capacitors, each of the plurality of capacitors configured to store and output one of the plurality of analog voltages.

9. A method comprising:
comparing a plurality of analog voltages output from a first synaptic array to a predetermined threshold to generate a vector of bits, each bit of the vector of bits indicating whether one of the plurality of analog voltages exceeds the predetermined threshold;
processing the vector of bits, said processing the vector of bits comprising providing a pulse to each of a plurality of input wires of a second synaptic array when a corresponding bit of the vector of bits indicates that the predetermined threshold was exceeded;
in parallel with said processing of the vector of bits, converting the plurality of analog voltages to a vector of digital values; and
subsequent to said processing the vector of bits, providing a pulse to each of the plurality of input wires of the second synaptic, each pulse having a duration proportional to a corresponding digital value of the vector of digital values.

10. The method of claim 9, wherein:
each of the first and second synaptic arrays comprises a plurality of ordered input wires, a plurality of ordered output wires, and a plurality of synapses, each of the synapses operatively coupled to one of the plurality of input wires and to one of the plurality of output wires.

11. The method of claim 10, wherein each of the plurality of synapses comprises a resistive element configured to store a weight of a neural network.

12. The method of claim 9, wherein the synaptic arrays are configured as a trained neural network.

13. The method of claim 9, wherein each of the plurality of analog voltages corresponds to an unsigned value.

14. The method of claim 9, wherein each of the plurality of analog voltages corresponds to a signed value.

15. The method of claim 14, wherein the at least one comparator comprises at least two comparators and wherein comparing the plurality of analog voltages to the predetermined threshold comprises applying a first comparator to the analog voltages to determine a sign and applying a second comparator to the analog voltages to determine whether they exceed the predetermined threshold.

16. The method of claim 9, wherein the first synaptic array comprises a plurality of capacitors, each of the plurality of capacitors configured to store and output one of the plurality of analog voltages.

17. A computer program product for operating neural network circuits, the computer program product comprising a non-transitory computer readable storage medium having program instructions embodied therewith, the program instructions executable by a processor to cause the processor to perform a method comprising:
comparing a plurality of analog voltages output from a first synaptic array to a predetermined threshold to generate a vector of bits, each bit of the vector of bits indicating whether one of the plurality of analog voltages exceeds the predetermined threshold;
processing the vector of bits, said processing the vector of bits comprising providing a pulse to each of a plurality of input wires of a second synaptic array when a corresponding bit of the vector of bits indicates that the predetermined threshold was exceeded;
in parallel with said processing of the vector of bits, converting the plurality of analog voltages to a vector of digital values; and
subsequent to said processing the vector of bits, providing a pulse to each of the plurality of input wires of the second synaptic, each pulse having a duration proportional to a corresponding digital value of the vector of digital values.

18. The computer program product of claim 17, wherein:
each of the first and second synaptic arrays comprises a plurality of ordered input wires, a plurality of ordered output wires, and a plurality of synapses, each of the synapses operatively coupled to one of the plurality of input wires and to one of the plurality of output wires.

19. The computer program product of claim 18, wherein each of the plurality of synapses comprises a resistive element configured to store a weight of a neural network.

20. The computer program product of claim 17, wherein the synaptic arrays are configured as a trained neural network.

\* \* \* \* \*